US005667650A

United States Patent [19]
Face et al.

[11] Patent Number: 5,667,650
[45] Date of Patent: Sep. 16, 1997

[54] HIGH FLOW GAS MANIFOLD FOR HIGH RATE, OFF-AXIS SPUTTER DEPOSITION

[75] Inventors: Dean Willett Face, Wilmington, Del.; Kirsten Elizabeth Myers, Philadelphia, Pa.

[73] Assignee: E. I. Du Pont de Nemours and Company, Wilmington, Del.

[21] Appl. No.: 389,704

[22] Filed: Feb. 14, 1995

[51] Int. Cl.$^6$ ................................................. C23C 14/34
[52] U.S. Cl. ........................... 204/298.07; 204/298.11; 204/192.24; 505/475; 505/476; 505/731
[58] Field of Search ................... 204/298.07, 298.11, 204/192.12, 192.24; 505/475, 476, 731

[56] References Cited

U.S. PATENT DOCUMENTS

| 4,392,931 | 7/1983 | Maniv et al. | 204/298.07 |
|---|---|---|---|
| 4,425,218 | 1/1984 | Robinson | 204/298.07 |
| 4,990,229 | 2/1991 | Campbell et al. | 204/298.07 |
| 5,134,117 | 7/1992 | DiIorio et al. | 505/1 |
| 5,252,551 | 10/1993 | Wu et al. | 505/1 |
| 5,290,758 | 3/1994 | Wordenweber | 204/192.24 |
| 5,340,459 | 8/1994 | Takehara | 204/298.07 |

FOREIGN PATENT DOCUMENTS

| 63-307254 | 12/1988 | Japan | 204/298.07 |

OTHER PUBLICATIONS

Kageyama et al., "Effect of a declination angle of substrate position on magnetron sputter deposition from a yttrium barium copper oxide target", Apply. Phys. Lett. 55 (10), pp. 1035–1037, Sep. 4, 1989.
DiIorio, M.S. et al, "Practical high $T_c$ Josephson junctions and dc SQUIDs operating above 85 K," Appl. Phys. Lett. 58(22), 2552–2554 (1991).
Kocian, P. et al., "Influence of Gas Flow Direction on DC Glow–Discharge Deposited a–Si Films," J. of Non–Crystalline Solids 59 & 60, 675–678 (1983).
Ishii, K., "High–rate Low Kinetic Energy Gas–flow–sputtering System," J. Vac. Sci. Technol. A, 7, 256–258 (1989).

Dong, Z.W. et al, "A Method for Increasing the $I_cR_n$ Products in YBCO/Au/YBCO Junctions," Oral presentation at Workshop on HTS Josephson Jucntions and 3–Terminal Devices, Univ. of Twente Enschede, The Netherlands, Mar. 2–4, 1994.
Reintsema, C.D. et al. (Electromagnetc Technology Division, NIST, Boulder, CO), "The Critical Current and Normal Resistance of High–$T_c$ Step–Edge SNS Junctions," (manuscript submitted Oct. 16, 1994).
Jung, T. et al, "High Rate Deposition of Alumina Films by Reactive Gas flow Sputtering," Surface and Coatings Technology, 59, 171–176 (1993).
Maniv, S. et al, "High Rate Deposition of Transparent Conducting Films by Modified Reactive Planar Magnetron Sputtering of $Cd_2Sn$ Alloy," J. Vac. Sci. Technol., 18(2), 195–198 (1981).
"The Top Sputtering Gun," AJA International.
Ishii, K. et al, "Sputtering of Cu in a High Pressure Atmosphere", Appl. Sur. Science 33/34, North–Holland, Amsterdam, 1107–1113 (1988).
Ishii, K. et al, "Iron Films Sputter–deposited by Utilizing Ar Gas Flow," IEEE Transactions on Magnetics, MAG–23(5), 2734–2736 Sep. (1987).
Eom, C.B. et al, "Synthesis and properties of $YBa_2Cu_3O_7$ thin films grown in situ by 90° off–axis single magnetron sputtering," Physica C 171, North–Holland, Amsterdam, 354–382 (1990).
Fursenko, A.A. et al, "Mathematical Simulation of Transport Processes in Modern Sputter–deposition Techniques of Thin Films," J. of Crystal Growth 148, 155–164 (1995).

Primary Examiner—R. Bruce Breneman
Assistant Examiner—Rodney G. McDonald

[57] ABSTRACT

An improved device for off-axis magnetron sputter deposition of inorganic oxide compounds having a sputter gun, target, substrate, gas flow means and enclosure chamber wherein the improvement comprises a hollow gas flow manifold positioned between the substrate and the target having at least one gas inlet and at least one outlet opening on the manifold, said outlet opening positioned to direct the gas flow away from the target and in the direction of the substrate, and a process for such deposition are disclosed.

11 Claims, 8 Drawing Sheets

HIGH FLOW GAS MANIFOLD FOR HIGH RATE, OFF-AXIS SPUTTER DEPOSITION

FIELD OF THE INVENTION

This invention relates to an improved device and process of manufacturing oxide thin films by sputter deposition involving the use of a gas flow manifold to direct the plasma away from the target and in the direction of the substrate which produces higher deposition rates and a more uniform deposition rate over a large area.

BACKGROUND OF THE INVENTION

High Temperature Superconductors are of great technological importance due to the fact that their transition temperatures can be greater than the boiling point of liquid nitrogen. High temperature superconductor materials, which are generally copper oxides, have been made in several forms, e.g., powders, single crystals, etc. Thin films of superconducting materials are useful in several applications including magnetometry and electronics.

There are many ways of depositing a thin film of material. In making films thinner than 1 µm, vapor deposition methods are generally used. One such method is planar magnetron sputtering. In this method, a plasma is generated near the surface of a target, a large (e.g., 7.5 cm dia. ×0.75 cm thick) disk of the material to be deposited. Typically, argon or another noble gas is used as the sputtering agent; in reactive sputtering, a partial pressure of reactive gas (the gas reacts with the target material to form the desired compound to be deposited) is used. The target is biased so that ions from the plasma are accelerated toward it. Ions hitting the target knock material, on an atomic scale, off of the surface. A magnetic field, generated by permanent magnets situated behind the targets, is used to localize and enhance the plasma near the target surface. The ejected material is collected on a "substrate" which is usually situated opposite and some distance from the target, typically just beyond the extent of the plasma. The substrate is often heated giving the adsorbed atoms enough surface mobility to arrange themselves into a crystal lattice.

Applying the sputtering technique to the deposition of oxide thin films was not straightforward. The problem is that oxygen ions (from a ceramic target or as a reactive gas necessary to form the oxide superconductors) are also generated by the plasma. The negatively charged oxygen ions are accelerated away from the negatively biased target and therefore toward the growing film. The oxygen ions then "sputter" away the film as it grows (negative ion bombardment). This phenomenon has two associated problems: 1) the growth rate of the thin film is strongly reduced, and 2) the oxygen ions, in some cases, preferentially sputter one element versus another leading to non-stoichiometric films.

The method of "off-axis" sputtering as shown in FIGS. 1A and 1B was developed to get around the negative ion bombardment problem. As shown in FIG. 1B this method consists of situating the substrate 1 not facing the target 2, but in the plane roughly perpendicular (about 70° to 90°) to the target, facing the plasma. As described above, Ar ions bombard the target (heavy arrows 3) generating a plasma. The plasma is contained by the field of the magnet assembly 4. In this case, the negative ions are not accelerated directly toward the growing film. Unfortunately, the growth rate of the film is substantially reduced as the momentum of the ejected material is also greatest directly out from the target (light arrows 5). Note that the arrows are meant to indicate overall flows, not individual atomic trajectories. Diffusion of the ejected material in the perpendicular direction is relied upon. Typically a higher pressure is used during off-axis sputtering. The higher pressure is also important in the formation of many of the copper oxide superconductors. Off-axis sputtering as generally practiced produces films with a large thickness gradient unless the substrate is rotated during deposition or multiple sputter sources are used.

A common element of nearly all "active" superconducting thin film circuits is the Josephson junction (JJ). The Josephson junction is a device which consists of two regions of superconducting material separated by a narrow region of non-superconducting material. In the Superconductor-Normal metal-Superconductor (SNS) Josephson junction, superconductivity is induced in the normal metal allowing a small supercurrent to flow through the metal without resistance. When the current through the JJ exceeds the "critical current" of the device, a voltage is generated across the device. This non-linearity can be used as a switch in an electronic circuit.

Fabrication of a JJ can be accomplished by depositing a superconducting film over a sharp step in a substrate and at an angle such that the step shadows an area next to it and the superconducting film is not continuous across the step. The necessity of depositing the film from one direction (directional deposition) precludes rotation of the substrate during deposition or the use of multiple sources arranged around the substrate.

The use of off-axis sputtering in making such devices is problematic because the thicknesses of the layers of the device strongly effect the device characteristics. The gas flow manifold of the present invention greatly improves the uniformity of the deposition and increases the overall growth rate.

The use of gas flow manifolds is known in thin film processing, for example, in reactive sputter deposition. If the sputtering rate of the reacted material is lower than that of the unreacted material, the partial pressure of the reactant gas is kept low at the target surface so that the sputter rate remains high, and at the same time, the reactant gas partial pressure is kept high near the substrate so that the material deposited is fully reacted. In such a case, the reactive gas may be admitted via a gas flow manifold as close as possible to the growing film on the substrate as in T. Jung and A. Westphal, Surface and Coatings Technology 59, 1993, pages 171–176 or in S. Maniv, C. Miner, and D. Westwood, J. Vac. Sci. Technol. 18, March 1981, pages 195–198. Alternatively, introduction of the non-reactive sputter gas as close as possible to the target is done in the commercial product, "A300" sputter gun with integral gas injection by AJA International, P.O. Box 246, 809 Country Way, North Scituate, Mass. 02060.

Thus a need exists for a sputter deposition technique which can produce a high deposition rate which is uniform over a large area and is suitable for growing both thin films and step-edge junctions. Applicants' invention provides such a deposition apparatus and process.

SUMMARY OF THE INVENTION

The present invention comprises an improved device for off-axis magnetron sputter deposition of inorganic oxide compounds having a sputter gun, target, substrate, gas flow means and enclosure chamber wherein the improvement comprises a hollow gas flow manifold positioned between the substrate and the target having at least one gas inlet and at least one outlet opening on the manifold, said outlet openings positioned to direct the gas flow away from the target and in the direction of the substrate. Preferably, the manifold is positioned closer to the target than to the substrate. This device permits use of a very high gas flow rate to provide uniform film coverage on large area substrates.

The present invention further comprises an improved process for off-axis planar magnetron sputter deposition wherein the improvement comprises use of the above-described device. The process and device are especially useful in the sputter deposition of thin films of superconducting compounds.

BRIEF DESCRIPTION OF THE DRAWINGS

FIG. 9 is a plane view of a $CeO_2$ sample made by off-axis planar magnetron sputtering utilizing the gas flow manifold device of the invention. The numbers represent the film deposition rate (in nm per minute) at different points across the sample.

FIG. 10 is a plane view of a $CeO_2$ sample made by off-axis planar magnetron sputtering as typically practiced. The numbers represent the film deposition rate (in nm per minute) at different points across the sample.

DETAILED DESCRIPTION OF THE INVENTION

Figure 1A:
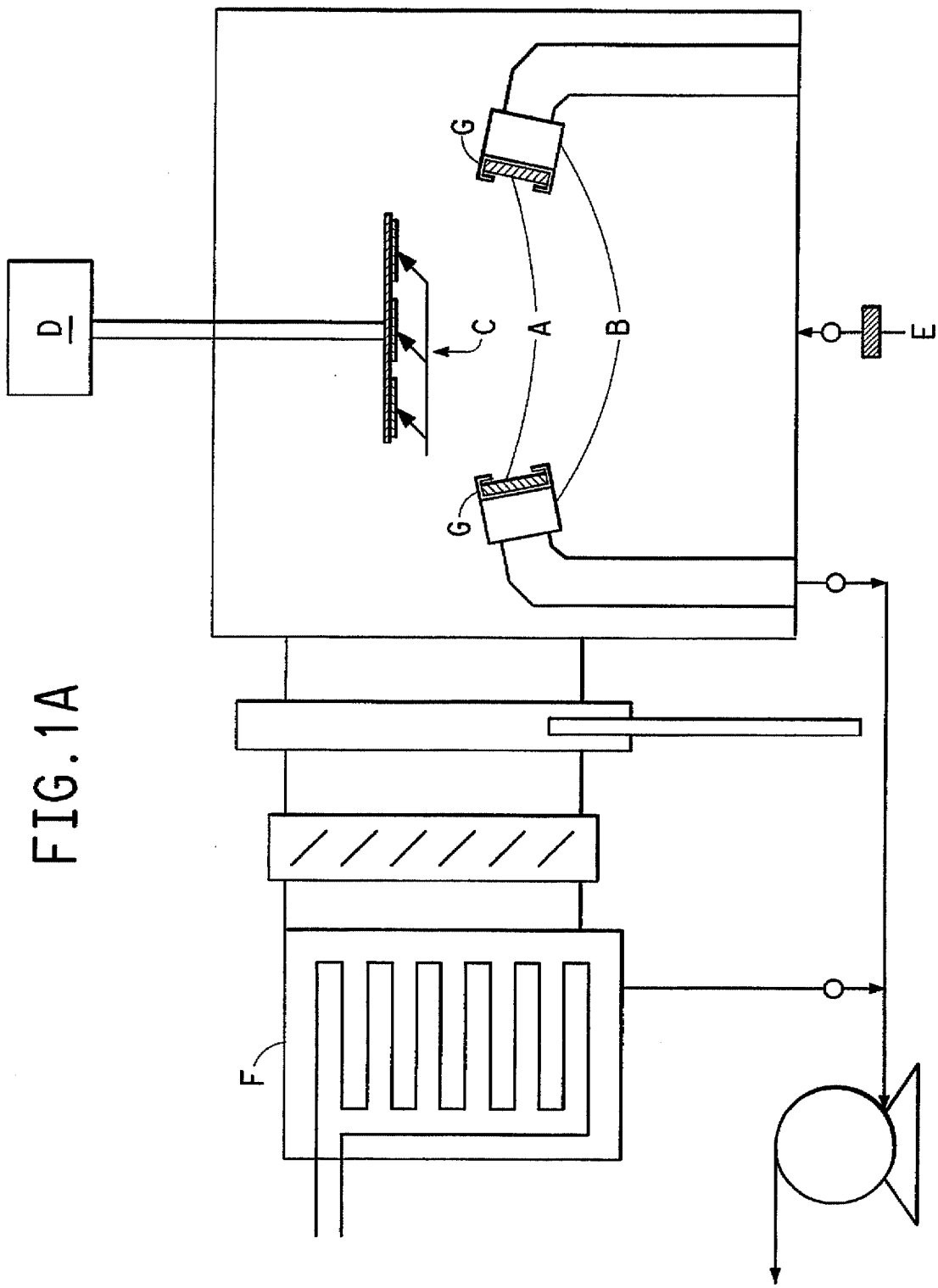
FIG. 1A is a schematic drawing of an off-axis planar magnetron sputtering apparatus as typically practiced.
Figure 1B:
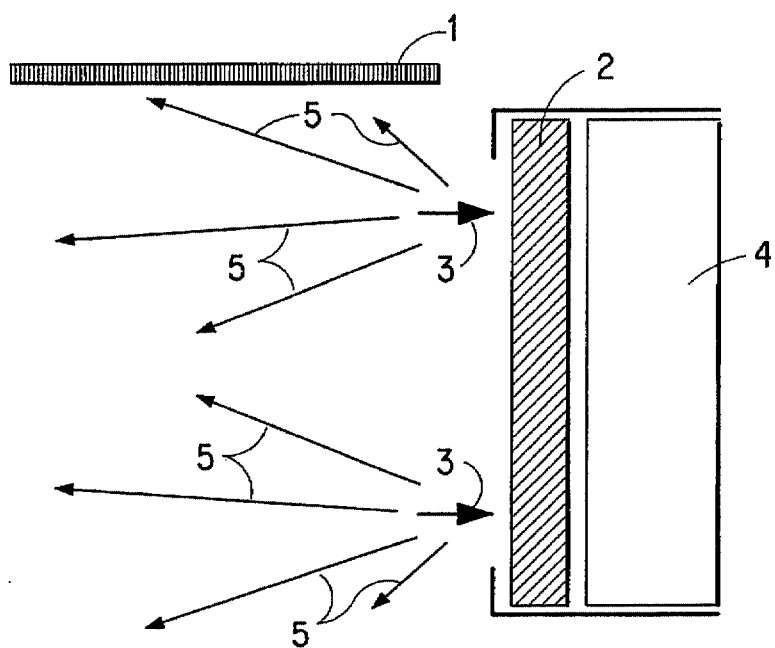
FIG. 1B is a schematic drawing of the sputtering process using the apparatus of FIG. 1A.

The present invention comprises an improved device and process for off-axis magnetron sputter deposition of inorganic oxide compounds as thin films. The device of the present invention is of the type having a sputter gun with a dark space shield, target, and gas flow means for deposition of thin films up to about 10 μm in thickness onto a substrate, all enclosed within a chamber capable of being under vacuum. Typically, a pump is used to effect a vacuum. As shown in FIG. 1A one or more magnetron sputter guns B are positioned by mechanical means inside the chamber with the appropriate electrical connections and water connections (to provide cooling). A target A is attached to the front surface of the gun B. The dark space shield G of the gun fits over the target, covering the edges, but leaving the majority of the target surface exposed. The substrate C is positioned relative to the targets of the guns as shown. The substrate C may be rotated if desired using mechanism D. Gas is supplied to the chamber via inlet E. A vacuum is created in the chamber using vacuum pump F.

In particular, the improvement of the present invention comprises a hollow gas flow manifold positioned between the substrate and the target. The gas flow manifold has at least one gas inlet, which is connected to a controllable gas source outside and separate from the chamber, and at least one, preferably several, gas outlet openings. The outlet openings are positioned to direct gas flow through the manifold and away from the target and in the direction of the substrate.

Figure 2:
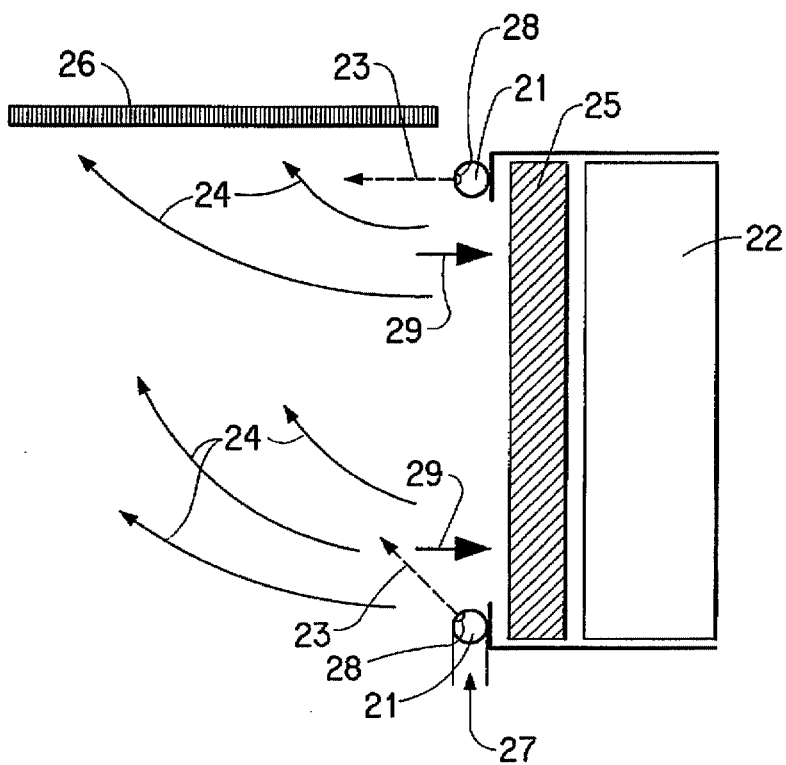
FIG. 2 is a schematic drawing of an off-axis planar magnetron sputtering process utilizing the gas flow manifold apparatus of the invention.

One arrangement of the device of the present invention is shown in FIG. 2. The gas flow manifold 21 (shown in cross-section) is positioned in front of the dark space shield 22 of a sputter gun (shown in part) used in off-axis planar magnetron sputtering. Argon ions bombard the target 25 in the direction indicated by dark arrows 29 causing ejection of material from target 25 and generating a plasma of sputtered material. The momentum of the plasma is directed by the gas flow. The gas flow, dashed arrows 23, carries the sputtered material, solid arrows 24, up and out from the target 25, toward the substrate 26.

The gas flow manifold comprises a hollow manifold with a single inlet 27, or multiple inlets, at the bottom of the manifold, and a number of small outlet openings 28 on the manifold. The term "openings" is used herein to mean outlet holes or slots of any geometric shape including, for example, circular, rectangular, or oblong. The spacing and angles of the openings have been empirically determined so as to provide the most uniform film deposition. Preferably, the manifold is positioned closer to the target than to the substrate onto which the compound is to be deposited. The most preferred position for the manifold is adjacent to and in contact with the sputter gun's dark space shield around the opening through which the target is exposed as shown in FIG. 2.

The manifold is positioned so that the plane of the manifold, a plane which is parallel to its circumference, is parallel to the target surface. The outlet openings on the manifold face away from the target. The substrate is located so that its surface is at an angle of from about 45 to about 90 degrees relative to the target surface, and the distance from the substrate to the nearest part of the exposed target is from about 1 cm to about 50 cm in the direction perpendicular to the substrate surface, and the distance from the target to the nearest edge of the substrate is from about 1 cm to about 50 cm in the direction perpendicular to the target surface. Preferably, the substrate surface is at an angle of from about 70 to about 90 degrees relative to the target surface, and the distance from the substrate to the nearest part of the exposed target is from about 1 to about 25 cm in the direction perpendicular to the substrate surface, and the distance from the target to the nearest edge of the substrate is from about 1 to about 25 cm in the direction perpendicular to the target surface. Most preferably, these distances are from about 1.5 to about 3.5 cm.

The manifold can be made of any material which does not substantially degrade at the temperatures required for the deposition and in the presence of oxygen. Preferred materials are copper and stainless steel. The substrate temperature may be as high as 1300K depending on the material to be deposited.

The optimal parameters of the gas flow manifold, such as the number and size of the openings and the tubing inner diameter depend on the pressure in the chamber during deposition and the gas flow rates. The parameters given below pertain to a gas flow manifold used to deposit material at chamber pressures in the range typical of off-axis sputtering, 100–200 mtorr (13.3 to 26.6 Pa). To utilize such a manifold most effectively at lower pressures, the velocity of the gas from the outlet openings is higher and vice versa. The velocity of the gas coming through the openings may be increased by reducing the size of the openings, and/or reducing the number of openings for a given gas flow. Alternatively, for a given opening configuration, the velocity of the gas could be increased by increasing the gas flow rate, provided that the gas flow is not limited by the inner diameter of the gas flow manifold, or the tubing related to the supply of the gas to the manifold. While this invention is not bound by theory, it is believed that the minimum operable gas flow velocity is greater than the diffusivity divided by the largest distance between the target and the substrate. Diffusivity=($\frac{1}{3}$) $\bar{c}$l wherein $\bar{c}$ is the mean velocity of the gas molecules, and l is the mean free path at operating pressure.

Typically, the cross-section of the inside of the gas flow manifold is from about 0.11 cm$^2$ to about 1.3 cm$^2$, preferably from about 0.14 cm$^2$ to about 0.22 cm$^2$. The cross section of the manifold need not be round, and can vary. Typically, the gas flow manifold will have 10 to 20 circular outlet openings of diameters from about 1.0 to about 1.6 mm resulting in a total opening cross-section approximately equal to the cross-section of the inside of the hollow manifold.

The overall shape of the manifold can vary with the shape of the sputtering gun or target. For example, the manifold can be circular, rectangular, in the form of two parallel cylinders and other shapes. Preferably the shape of the manifold corresponds to the shape of the target employed. In the case of a gun with a circular target, a circular (annular) gas flow ring is preferred. Preferably, the manifold inner diameter is approximately the same as the diameter of the opening of the dark space shield of the sputter gun.

Figure 3:
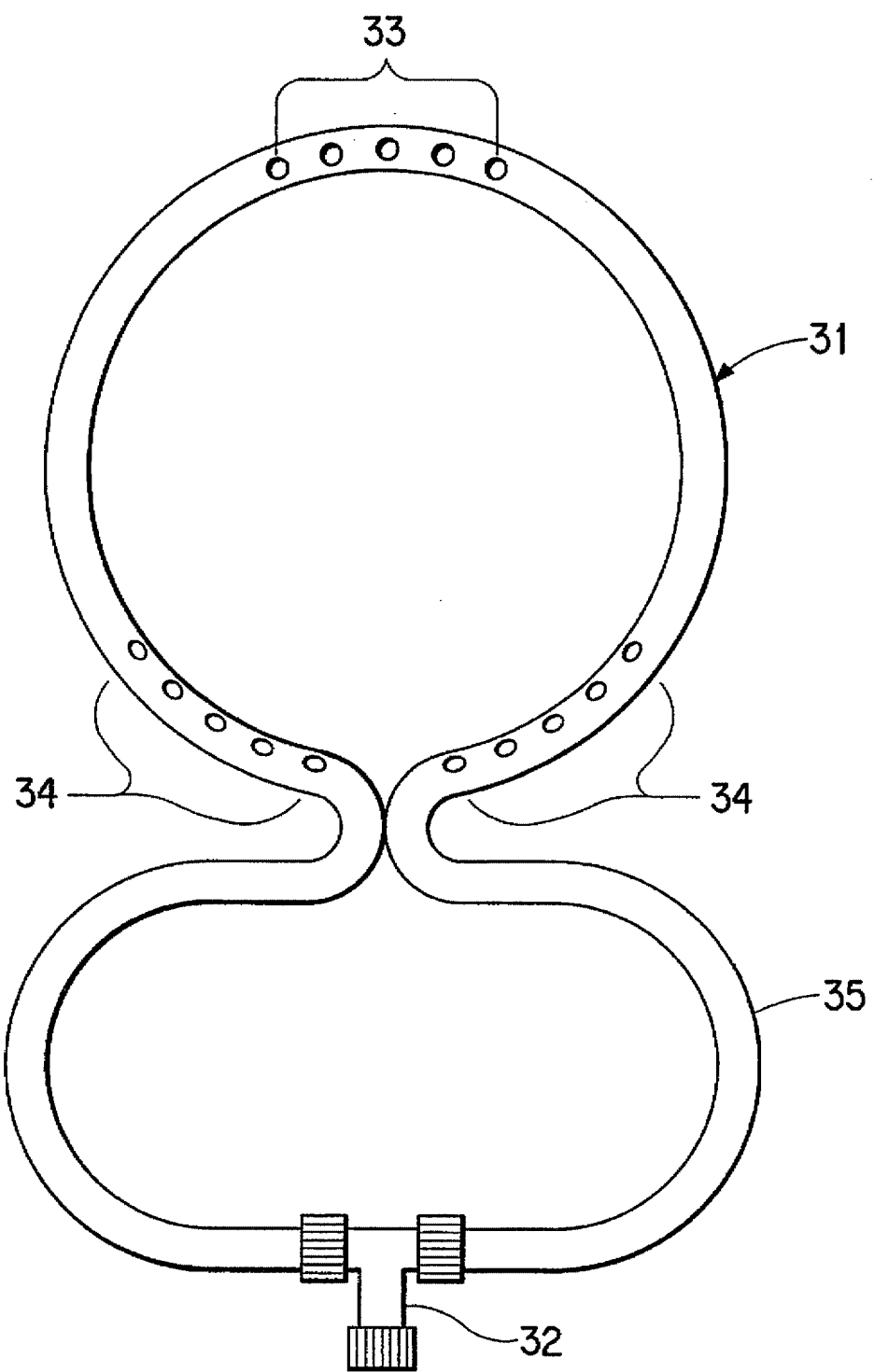
FIG. 3 is a plane view of a gas flow manifold apparatus of the invention in the form of a ring.

FIG. 3 depicts one manifold of the present invention in the configuration of a ring. Ring 31 contains one gas inlet 32 and two groups of outlet openings 33 and 34. The openings in group 33 are positioned approximately perpendicular to the manifold's plane, a plane of the manifold parallel to the manifold's circumference, at from about 80 to about 110 degrees to the plane, preferably at about 90 degrees to the manifold's plane. The openings in group 34 are positioned at a discrete distance from those of group 33, and are at from about 30 to about 60 degrees to the manifold's plane, preferably at about 45 degrees to the manifold's plane, and pointing towards the center of the ring. The openings of the first group, group 33, are centered around a point on the ring which is closest to the substrate and the openings in the second group, group 34 are centered around a point of the ring which is furthest away from the substrate. In the device of FIG. 3, the individual outlet openings within each group are spaced at from about 0.9 to about 1.1 cm apart from each other. The shape of the lower section 35 of the ring is unimportant and can be chosen for ease of fabrication.

Figure 4A:
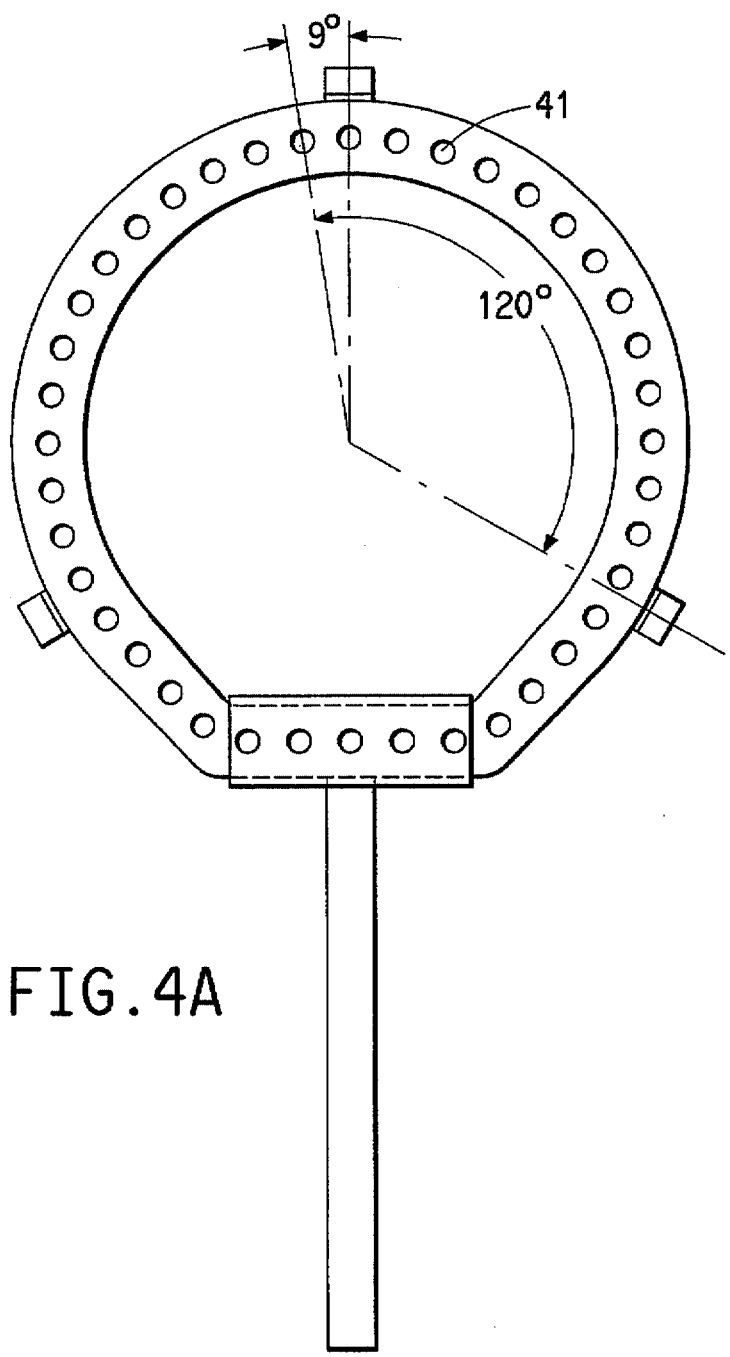
FIG. 4 is a plane view of an alternate configuration of the gas flow manifold apparatus of the invention in the form of a ring.
Figure 4B:
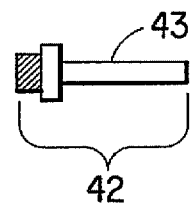

An alternate ring geometry, which can be machined from stainless steel, is shown in FIG. 4A. This ring has forty tapped openings 41 distributed evenly around the ring on one face. The openings can either be plugged off with a screw, or fitted with nozzles 42 as shown in FIG. 4B. The nozzles have thin walled stainless steel tubing (of varying diameters) 43 which can be bent to the appropriate direction, and/or cut to a shorter length.

It is desirable that the gas flow symmetrically to both sides of the ring. The configuration of the openings is relevant to uniformity of the deposition. A ring with openings only across the bottom (at 45°) produces more deposition near the gun. A ring with smaller openings (#60 and #61 drill bit) across the top produces a film with thinner areas just in front of each opening (as if the gas flow were too high and carried the material away from those areas). These observations pertain to the depositions conditions described in the Examples. Moreover, the gas flow manifold, in terms of the size, number, and positions of the openings, can be optimized for different gas flow rates, pressures, and substrate positions. One advantage of the ring shown in FIG. 4A is that it has the flexibility to allow such optimization.

It is desirable for the gas flow through the manifold to be symmetrical. Preferably it is symmetrical around a plane, said plane being defined by a first line perpendicular to a target surface at the center of the target and a second line perpendicular to the surface of the substrate and at the center of the area over which deposition will occur, provided that these two lines intersect.

Gases suitable for use herein include oxygen and noble gases used as the sputtering agent such as Ar, Ne, Kr or Xe. Preferred for use in the present invention is a mixture of argon and oxygen. As noted above, the most effective gas flow rate depends upon the pressure in the chamber and the number and size of the outlet openings. A minimum gas flow rate of about 200 standard cubic centimeters per minute is suitable. Higher gas flow rates, such as from about 450 to about 650 standard cubic centimeters per minute are preferred.

The device and process of the present invention provides a means of obtaining a combination of a high sputter deposition rate and uniform compound deposition. The increase in sputter rate is 2 to 4 times higher than that obtainable with the same device minus the manifold improvement of the present invention. Prior art techniques for directional deposition (e.g., not utilizing multiple guns or substrate rotation) have achieved a uniform deposition on substrates of up to 7.5 cm in diameter by use of high pressures and low deposition rates. When higher rates were achieved uniformity suffered. The present invention provides a technique for achieving directional deposition with both high sputter deposition rate and uniform thickness of the deposited compound (thin film) and is also useful in the preparation of Josephson junctions.

Figure 5:
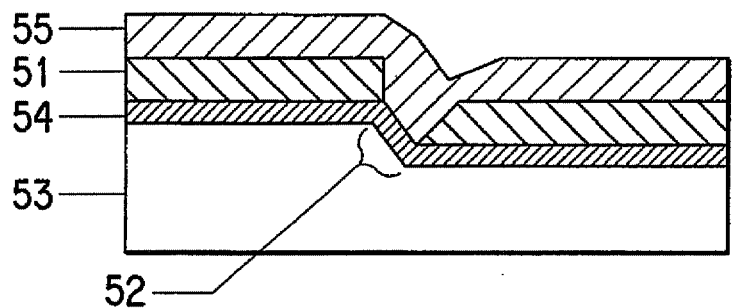
FIG. 5 is a schematic cross-sectional drawing of a step-edge SNS Josephson Junction.

FIG. 5 depicts a Josephson junction (JJ). Fabrication of a JJ may be accomplished by depositing a superconducting film 51 over a sharp step 52 in a substrate 53, which may optionally be coated with a buffer layer 54, and then depositing a normal metal film 55 on top of the superconducting film. The superconductor must be deposited at an angle such that the step shadows an area next to it and the superconducting film is not continuous across the step. The normal metal must be deposited in such a way that the metal fills the gap between the two superconducting banks. The necessity of depositing the film from one direction (directional deposition) precludes rotation of the substrate during deposition or the use of multiple sources arranged around the substrate.

Figure 6:
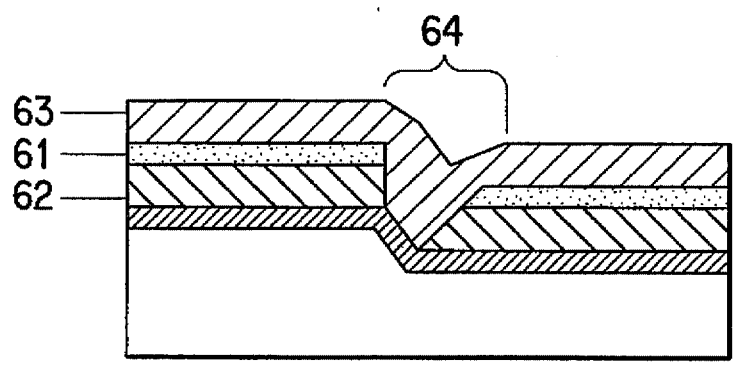
FIG. 6 is a schematic cross-sectional drawing of an improved step-edge SNS Josephson Junction incorporating an insulating layer between the superconductor and the normal metal.

An improved JJ structure, shown in FIG. 6, has been demonstrated wherein the improvement consists of the addition of an insulating film 61 between the superconducting film 62 and the normal metal 63 in all areas of the device except at the Junction itself 64 where the superconductor and normal metal must be in electrical contact, and at the device contact pads. With this additional insulator layer, electrical current flowing through the device is confined to the superconducting layer, except at the junction, as opposed to the case of FIG. 5, where the current can flow into the normal metal over a large area. All else being equal, the device of FIG. 6 will have a higher resistance than the device of FIG. 5, and therefore can generate a larger switching voltage. The device and process of the present invention are suitable for use in preparation of either type of JJ.

Compounds suitable for deposition using the present invention are inorganic oxide compounds. Preferred oxides are oxides of an element selected from the group consisting of Tl (e.g., $Tl_2O$, $Tl_2O_3$, $Tl_3O_4$, etc.), Pb (e.g., PbO, $PbO_2$, $Pb_3O_4$, $Pb_2O$, $Pb_2O_3$, etc.), Hg (e.g., $Hg_2O$, $H_2O_2$, HgO, etc.), As (e.g., $As_2O_3$, $As_2O_5$, $As_2O_4$, etc.), Cs (e.g., $Cs_2O$, $Cs_2O_3$, $Cs_2O_2$, $CsO_2$, $CsO_3$, etc.), P (e.g., $P_2O_5$, $P_2O_3$, etc.), Li (e.g., $Li_2O$, etc.), K (e.g., $K_2O$, KO, $KO_2$, etc.), Rb (e.g., $Rb_2O_3$, RbO, $Rb_2O$, $RbO_2$, etc.), Se (e.g., $SeO_2$, $SeO_3$, etc.), Na (e.g., $Na_2O$, $NaO_2$, $Na_2O_2$, etc.), S (e.g., $SO_2$, SO, $SO_4$, $SO_3$, etc.), Ga (e.g., $Ga_2O$, $Ga_2O_3$, etc.); Be (e.g., BeO, $B_2O_3$, etc.), Mg (e.g., MgO, etc. ), Al (e.g., $Al_2O_3$, etc. ), Si (e.g., $SiO_2$, SiO, etc.), Ca (e.g., CaO, etc.), Sc (e.g., $Sc_2O_3$, etc.), Ti (e.g., $TiO_2$, $Ti_2O_3$, etc.), V (e.g., $V_2O_5$, VO, $VO_2$, etc.), Cr (e.g., $CrO_2$, $CrO_2$, $Cr_2O_3$, etc.), Mn (e.g., MnO, $Mn_2O_3$, $Mn_3O_4$, $MnO_2$, etc.), Fe (e.g., FeO, $Fe_2O_3$, $Fe_3O_4$, etc.), Co (e.g., CoO, $Co_2O_3$, $Co_3O_4$, etc.), Ni (e.g., NiO, $Ni_2O_3$, etc.), Cu (e.g., CuO, $CuO_2$, $Cu_2O$, $Cu_4O_3$, etc.), Sr (e.g., SrO, $SrO_2$, etc.), Y (e.g., $Y_2O_3$, etc.), Zr (e.g., $ZrO_2$, etc.), Nb (e.g., $Nb_2O_5$, NbO, $Nb_2O_3$, $NbO_2$, etc.), Mo (e.g., $MoO_3$, $MoO_2$, $Mo_2O_3$, $Mo_2O_5$, etc.), Ru (e.g., $RuO_2$, $Ru_2$, $Ru_2O_3$, etc.), Pd (e.g., PdO, $PdO_2$, etc.), Ag (e.g., $Ag_2O$, $Ag_2O_3$, $Ag_3O_4$, etc.), Cd (e.g., CdO, $CdO_2$, etc.), In (e.g., InO, $In_2O_3$, $In_2O$, etc.), Sn (e.g., SnO, $SnO_2$, $Sn_3O_4$, $Sn_2O_3$, etc.), Sb (e.g., $Sb_2O_4$, $Sb_2O_5$, $Sb_2O_3$, etc.), Ba (e.g., BaO, $BaO_2$, etc.), La (e.g., $La_2O_3$, etc.), Ce (e.g., $CeO_2$, etc.), Pr (e.g., $Pr_2O_3$, $PRO_2$, etc.), Nd (e.g., $Nd_2O_3$, etc.), Sm (e.g., $Sm_2O_3$, etc.), Eu (e.g., $Eu_2O_3$, etc.), Gd (e.g., $Gd_2O_3$, etc.), Tb (e.g., $Tb_2O_3$, $Tb_4O_7$, etc.), Dy (e.g., $Dy_2O_3$, etc.), Ho (e.g., $Ho_2O_3$, etc.), Er (e.g., $Er_2O_3$, etc.), Tm (e.g., $Tm_2O_3$, etc.), Yb (e.g., $Yb_2O_3$, etc.), Lu (e.g., $Lu_2O_3$, etc.), Hf ($HfO_2$, etc.), Ta (e.g., $Ta_2O_5$, etc.), W (e.g., $WO_3$, $WO_2$, $W_2O_5$, etc.), Re (e.g., $ReO_2$, $Re_2O_7$, $ReO_3$, etc.), Os (e.g., $OSO_2$, etc.), Ir (e.g., $IrO_2$, $Ir_2O_3$, etc.), and U (e.g., $UO_2$, etc.). It is understood that the oxides listed above may contain some portion of mixed oxides, but are still within the scope of materials useful in the practice of this invention.

Preferred compounds suitable for deposition using the present invention are superconducting compounds. Various types of superconductors include the following categories: REBaCuO (RE=Y, Nd, Sin, Eu, Gd, Dy, Ho, Er, Tm, Yb, Lu), TlBaCaCuO, TlPbSrCaCuO, BiSrCaCuO, HgBaCaCuO, LaSrCuO, LaBaCuO, BaBiPbO, and BaKBiO, where it is understood that said categories include compounds in which there are limited amounts of elemental substitutions that do not substantially change the nature of the compounds. Particular compounds suitable for use herein include: $REBa_2Cu_3O_{7-x}$ (x=0 to 0.5; RE=Y, Nd, Sm, Eu, Gd, Dy, Ho, Er, Tm, Yb, Lu); $TlBa_2Ca_{n-1}Cu_nO_{2n+3}$ wherein n=1, 2, 3 or 4; $Tl_2Ba_2Ca_{n-1}Cu_nO_{2n+4}$ wherein n=1, 2, 3 or 4, $Tl_{0.5}Pb_{0.5}Sr_2Ca_{n-1}Cu_nO_{2n+3}$ wherein n=1, 2, or 3, and $HgBa_2Ca_{n-1}Cu_nO_{2n+2}$ wherein n=1, 2, 3.

Substrates suitable for use in the present invention include silicon, yttrium stabilized zirconia, GaAs, $LiNbO_3$, $Al_2O_3$, $NdGaO_3$, MgO, $SrTiO_3$, $LaAlO_3$, glass and others. Substrates larger than 1 cm square are appropriate for use herein, preferably greater than 2 cm square. The term "substrate" as used herein includes substrates having an intervening layer between the substrate and deposited oxide. An example of such a layer is a buffer layer.

The process of the present invention can be used to deposit distinct compounds sequentially. For example, especially preferred is the deposition of cerium oxide as a first layer and a superconducting compound as a second layer on top of the cerium oxide. Alternatively, a first layer, such as cerium oxide, can be deposited by conventional techniques, and the superconducting compound deposited by use of the device and process of the present invention.

The device and process of the present invention are useful for deposition of thin films of inorganic oxide compounds. The films can be superconducting, semiconducting, conducting, insulating, ferroelectric, or films for optical coatings or wear resistant coatings. Superconducting films are used as components in microwave and millimeter wave devices for electronics and communications. Examples of such devices include delay lines, filters, phase shifters and Josephson junctions.

EXAMPLE 1

A three inch (7.62 cm) diameter silicon substrate (Virginia Semiconductor, 1501 Powhaten St., Fredericksburg, Va. 22401) was placed, polished side down, into a stainless steel ring having four small tabs at the bottom to support the wafer. The metal ring and silicon substrate were suspended from the top of a vacuum chamber (L560 Deposition System from Leybold Technologies Inc., 120 Post Rd., Enfield, Conn.) such that the substrate faced the bottom of the chamber.

A three inch (7.62 cm) diameter planar magnetron sputter gun (Leybold Technologies Inc., 120 Post Rd., Enfield, Conn.) was positioned such that the top of its dark space shield was about 0.5 cm. horizontally and 1 cm vertically away from the closest edge of the silicon wafer and that the plane of the target formed a 75° angle with the substrate surface. The target was a 7.34 cm diameter ×0.48 cm thickness $YBa_2Cu_3O_7$ ceramic target bonded to a Cu cup (SSC Inc., 18916 North Creek Parkway, Suite 110, Bothell, Wash. 98011).

A piece of 6.35 mm OD., 0.76 mm wall thickness soft Cu "refrigeration" tubing (Mueller Brass Co., Fulton, Miss.) was bent into a gas flow ring of the form shown in FIG. 3. The upper section 31 of the "ring", had an inner diameter of about 7.06 cm, just larger than the opening of the dark space shield through which the target was exposed. Because the shaping of the gas flow ring was done by hand, it was not a perfect circle. The function of the lower section of the ring was simply to provide symmetrical gas flow to both sides of the ring. The structure was completed with a Swagelok "¼ inch (0.64 cm), Tee" fitting 32 (Swagelok Co., Solon, Ohio 44139).

A number of holes were drilled with a #54 drill bit (1.30 mm diameter) into the face of the ring. At the top of the ring and centered left to right, 5 holes were positioned approximately 1.1 cm apart and facing directly out at about 90° to the plane of the ring 33. On each side of the lower sections, another 5 holes were positioned approximately 0.9 cm apart, extending from close to the bottom of the ring to mid-way up the side 34. The holes were drilled such that they point toward the center of the ring and facing out at about 45° (relative to the plane of the ring). The copper ring was attached to the dark space shield such that it lay flat against the dark space shield with the holes facing away from the target as in shown FIG. 2.

The chamber was first evacuated to approximately $1\times10^{-5}$ torr ($1.33\times10^{-3}$ Pa) with a cryopump (On Board system by CTI Cryogenics, 9 Hampshire St., Mansfield, Mass. 02048). Gas flows of 280 sccm (standard cubic centimeters per minute) Ar and 280 sccm $O_2$ were admitted to the chamber, via MKS mass flow controllers (MKS, 6 Shattuck Rd., Andover, Mass. 01810) and the gas flow ring. A variable throttle valve was used to set the pressure at 150 mtorr (19.95 Pa).

The target was first "presputtered" to remove contamination from its surface. The sputter gun was supplied with 50 W DC from a power supply (model RFX-600, Advanced Energy Industries Inc., 1600 Prospect Parkway, Fort Collins, Colo. 80525) generating a self-bias of −72 V (with RF matching network and ATX-600 tuner, Advanced Energy Industries Inc.) and run for a few minutes. Then 75 W of DC power were supplied to the sputter gun with an second power supply (model MDX-500, Advanced Energy Industries Inc.). A shutter beneath the silicon wafer was rotated to the side and the deposition proceeded for 120 minutes.

Figure 7:
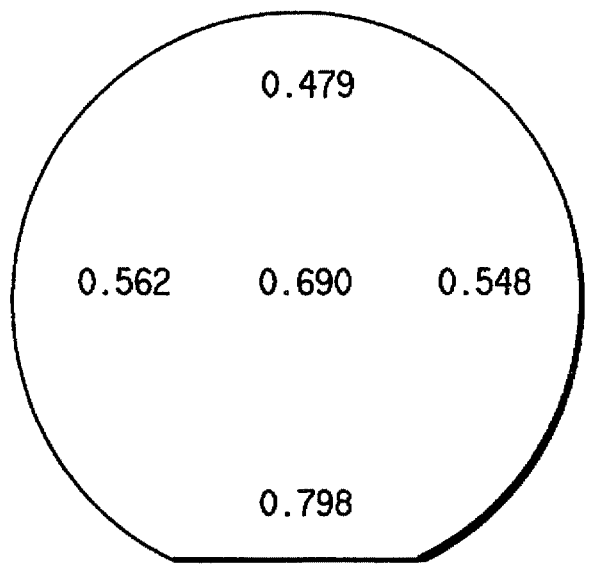
FIG. 7 is a plane view of a $YBa_2Cu_3O_{7-x}$ wherein x is 0 to 0.5 sample made by off-axis planar magnetron sputtering utilizing the gas flow manifold device of the invention. The numbers represent the film deposition rate (in nm per minute) at different points across the sample.
Figure 8:
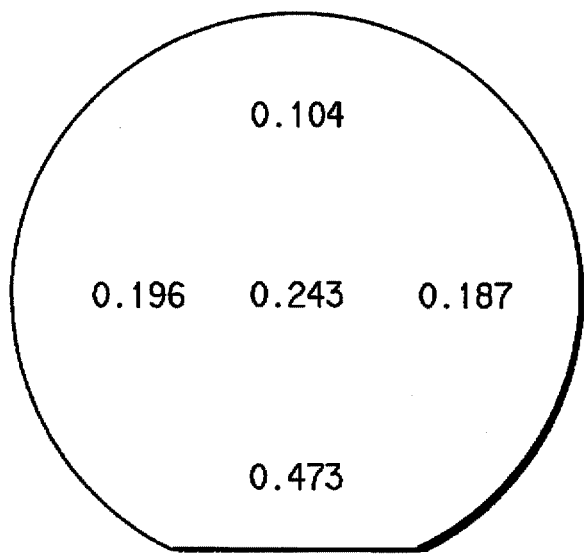
FIG. 8 is a plane view of a $YBa_2Cu_3O_{7-x}$ wherein x is 0 to 0.5 sample made by off-axis planar magnetron sputtering as typically practiced. The numbers represent the film deposition rate (in nm per minute) at different points across the sample.

After the deposition, the silicon wafer was removed from the chamber and sent to the University of Arizona (courtesy of Prof. John Leavitt, Department of Physics, Tuscon, Ariz. 85721) for compositional analysis by Rutherford Backscattering (RBS). The deposition rate of the film, measured at different positions across the substrate, is given in FIG. 7 in nm per minute (the flat was positioned closest to the sputter gun). FIG. 8 shows the film deposition rate for a sample grown under similar conditions but with a more typical gas flow rate, 85 sccm each Ar and $O_2$ and with the gas admitted at the bottom of the chamber (no gas flow ring). This deposition run was extended for 240 min. so that the film thicknesses, and therefore the error in the rates, would be comparable (approximately 2%). Note that there is a factor of greater than 4 difference between the deposition rate close to, and far from, the gun for the deposition without the gas flow ring (FIG. 8). With the ring, this difference is less than a factor of two and the overall deposition rate (average of the five data points) is more than twice as high (FIG. 7).

EXAMPLE 2

A three inch (7.62 cm) diameter silicon substrate was positioned in the deposition chamber as in Example 1. A three inch (7.62 cm) diameter planar magnetron sputter gun (Leybold Technologies Inc.) was positioned such that the top of its dark space shield was about 2 cm horizontally and 1.5 cm vertically away from the closest edge of the silicon wafer and that the plane of the target formed a 72° angle with the substrate surface. The target was a 7.37 cm diameter ×3.18 cm $CeO_2$ ceramic target bonded to a Cu cup (Superconductive Components, Inc., 1145 Chesapeake Ave., Columbus, Ohio 43212).

The copper gas flow ring of Example 1 was attached to the dark space shield such that it lay flat against the dark space shield with the holes facing away from the target.

The chamber was first evacuated to approximately $1\times10^{-5}$ torr ($1.33\times10^{-3}$ Pa) with a cryopump (On Board system by CTI Cryogenics). Gas flows of 280 sccm (standard cubic centimeters per minute) Ar and 280 sccm $O_2$ were admitted to the chamber, via MKS mass flow controllers and the gas flow ring. A variable throttle valve was used to set the pressure at 150 mtorr (19.95 Pa).

The target was first "presputtered" to remove contamination from its surface. The sputter gun was supplied with 100 W DC from a power supply (model RFX-600, Advanced Energy Industries Inc.) generating a self-bias of −228 V (with RF matching network and ATX-600 tuner, Advanced Energy Industries Inc.) and run for thirty minutes during which time the self bias decreased to −203 V. A shutter beneath the silicon wafer was rotated to the side and the deposition proceeded for 180 minutes.

After the deposition, the silicon wafer was removed from the chamber and sent to the University of Arizona (courtesy of Prof. Larry Mcintyre, Department of Physics, Tuscon, Ariz. 85721) for compositional analysis by Rutherford Backscattering (RBS). The deposition rate of the film, measured at different positions across the substrate, is given in FIG. 9 in nm per minute (the flat was positioned closest to the sputter gun). FIG. 10 is the film deposition rate for a sample grown under the same conditions, but with the gas admitted at the bottom of the chamber (no gas flow ring). This deposition run was extended for 300 min. so that the film thicknesses, and therefore the error in the rates, would be comparable (approximately 6%). Note that there is a factor of greater than 2.5 difference between the deposition rate close to, and far from, the gun for the deposition without the gas flow ring (FIG. 10). With the ring, this difference is less than a factor of 1.4 and the overall deposition rate (average of the five data points) is almost twice as high (FIG. 9).

EXAMPLE 3

Step-edge SNS Josephson Junctions (FIG. 5) were fabricated in multiple positions across a 5 cm diameter substrate by the following process.

First a 5.08 cm diameter yttrium stabilized zirconia (YSZ) substrate (Zirmat, N. Billerica, Mass. 01862) was coated with a 120 nm thick film of titanium. A 0.5 μm AZ 5206 positive photoresist (Hoechst Celanese Corp., 70 Meister Ave., Somerville, N.J. 08876) film was spin coated on the sample at 4,000 rpm for 30 sec. The resist was cured in air at 90° C. for 25 min. The areas of the resist to be removed were exposed to UV light at an intensity of about 100 mJ/cm². The sample was immersed in AZ 422MIF developer (Hoechst Celanese Corp.) for 60 sec. to remove the photoresist that was exposed to UV light. The exposed areas of the Ti film were then etched through by Reactive Ion Etching (RIE). The RIE system (C71/3MT by Cooke Vacuum Products, 13 Merrit St., Norwalk, Conn. 06854) was a conventional 13.56 MHz, parallel plate reactor with the power applied to the bottom electrode (RIE mode). The sample was etched at a DC self-bias of −50 V, a substrate temperature of 30° C., a gas flow of 5 sccm $SF_6$, and pressure of 60 mtorr (7.98 Pa). The chamber pressure was kept constant throughout the etching cycle by varying the pumping speed with an automatic throttle valve. These etching conditions provided an anisotropic etch profile with extremely smooth sidewalls. The remaining resist masking the Ti film was removed with acetone.

The pattern comprised seven die and two test squares. Each of the die areas was divided by a central step; one side was low, the other was high. The pattern was transferred into the YSZ substrate by standard $Ar^+$ ion beam milling through the Ti mask. The ion milling system (Millatron by Commonwealth Scientific Cop., 500 Pendleton St., Alexandria, Va. 22314) was operated with gas flows of 6 sccm $O_2$ and 6 sccm Ar resulting in a pressure of approximately $2 \times 10^{-4}$ torr ($2.66 \times 10^{-2}$ Pa). The 400 eV ion beam was incident on the water-cooled sample at a 45° angle and for a time of 18 min. and 20 sec. The remaining Ti mask was then removed by $SF_6$ RIE. The depth of the steps milled into the YSZ was 120 nm.

After being rinsed in acetone and isopropyl alcohol and exposed to a 10 min. $O_2$ RIE cleaning process, the YSZ substrate was placed, patterned side down, into a stainless steel ring having four small tabs at the bottom to support the wafer. The metal ring and YSZ substrate were suspended from the top of a vacuum chamber (L560 Deposition System from Leybold Technologies Inc.).

The chamber was equipped with two three inch (7.62 cm) diameter planar magnetron sputter guns and one e-beam evaporation source (all from Leybold Technologies Inc., 120 Post Rd., Enfield, Conn.). The "$CeO_2$gun" was positioned as in Example 2 and was equipped with the same $CeO_2$target as in Example 2. The "$YBa_2Cu_3O_{7-x}$ wherein x is 0 to 0.5 gun" was positioned as in Example 1 and was equipped with the same $YBa_2Cu_3O_{7-x}$ wherein x is 0 to 0.5 target as in Example 1. The two sputter guns were positioned approximately 90° from each other in the plane of the substrate. The e-beam evaporation source was positioned at the bottom of the chamber 24 cm below and 10 cm horizontal offset from the center of the substrate. The e-beam source material was 99.99% pure gold pellets (Materials Research Corporation, Orangeburg, N.Y.).

The copper gas flow ring of Example 1 was attached to the dark space shield of the "$YBa_2Cu_3O_{7-x}$ wherein x is 0 to 0.5 gun" such that it lay flat against the dark space shield with the holes facing away from the target. No gas flow ring was attached to the dark space shield of the "$CEO_2$gun."

The chamber was first evacuated to approximately $4 \times 10^{-5}$ torr ($5.32 \times 10^{-3}$ Pa) with a cryopump (On Board system by CTI Cryogenics). Gas flows of 280 sccm (standard cubic centimeters per minute) Ar and 280 sccm $O_2$ were admitted to the chamber, via MKS mass flow controllers and the gas flow ring of the "$YBa_2Cu_3O_{7-x}$ wherein x is 0 to 0.5 gun." A variable throttle valve was used to set the pressure at 150 mtorr (19.95 Pa).

A shutter in front of the "$YBa_2Cu_3O_{7-x}$ wherein x is 0 to 0.5 gun" (also in front of the gas flow ring) was opened and the target was presputtered to remove contamination from its surface. The sputter gun was supplied with 50 W DC from a power supply (model RFX-600, Advanced Energy Industries Inc.) generating a self-bias of −78 V (with RF matching network and ATX-600 tuner, Advanced Energy Industries Inc.) and run for ten minutes. The shutter in front of the "$YBa_2Cu_3O_{7-x}$ wherein x is 0 to 0.5 gun" was then closed. Then a shutter in front of the "$CeO_2$gun" was opened and the target was presputtered to remove contamination from its surface. The sputter gun was supplied with 100 W DC from a power supply (model RFX-600, Advanced Energy Industries Inc.) generating a self-bias of −143 V (with RF matching network and ATX-600 tuner, Advanced Energy Industries Inc.) and run for ten minutes. The shutter in front of the "$CeO_2$gun" was then closed.

Next the shutter in front of the substrate was opened. Two quartz halogen lamps (1500 W, Ushio America Inc., 60 Walnut Ave., Clark, N.J. 07066) were used to radiantly heat the YSZ substrate (by the method of DuPont patent application CR-8928-B). The temperatures noted in this example are the temperatures recorded by a K-type thermocouple located in the vicinity of, but not touching, the quartz heating lamps.

The temperature was ramped to 800° C. at a rate of 15° C./min. When the temperature reached 800° C., the shutter in front of the $CeO_2$gun was opened. The throttle valve was opened to lower the pressure in the chamber to 108 mtorr (14.36 Pa). The $CeO_2$ gun was operated at 100 W RF (−154V self-bias) for 60 minutes. The substrate was rotated during the cerium oxide deposition.

After the $CeO_2$ deposition, the temperature was ramped at 15° C./min. to 890° C. While the temperature was being adjusted, the $CeO_2$shutter was closed and the $YBa_2Cu_3O_{7-x}$ wherein x is 0 to 0.5 shutter opened. The throttle valve was readjusted to give a pressure of 150 mtorr (19.95 Pa) in the chamber. The substrate rotation was turned off and the substrate aligned such that the high side of the step in each die was closer to the $YBa_2Cu_3O_{7-x}$ wherein x is 0 to 0.5 gun; e.g., the step faced away from the $YBa_2Cu_3O_{7-x}$ wherein x is 0 to 0.5 source. Because it was difficult to see the pattern in the substrate, the wafer was misaligned by approximately 10°.

Once the temperature was at 890° C., the $YBa_2Cu_3O_{7-x}$ wherein x is 0 to 0.5 deposition was started. Seventy-five watts of DC power were supplied to the sputter gun with a second power supply (model MDX-500, Advanced Energy Industries Inc.) generating a self bias of −140 V and a current of 0.547 A. The deposition proceeded for 102 minutes.

At the end of the $YBa_2Cu_3O_{7-x}$ wherein x is 0 to 0.5 deposition, the gas flows were stopped, the valve to the cryopump closed, and the chamber backfilled to a pressure of 200 torr ($2.66 \times 10^4$ Pa) with oxygen (over a period of two minutes). The temperature was then ramped down to 150° C. at a rate of 5° C./min. At that point, the heaters were shut off and the chamber was pumped back down. The e-beam source was used to evaporate a 200 nm thick gold film. At the end of the gold deposition, the temperature was approximately 90° C. The chamber was again backfilled with oxygen and allowed to cool.

The wafer was then removed from the deposition chamber and patterned by a standard bi-level photolithography process and $Ar^+$ion beam milling. The bi-level process began with coating the wafer with KTI 496 k molecular weight standard polymethyl methacrylate (PMMA) at 9% solids (OCG Microelectronic Materials Inc., 3 Garret Mountain Plaza, W. Paterson, N.J., 07424). The thickness of the spun-on film was approximately 1.2 μm. The PMMA was cured at 170° C. for 30 min. in an evacuated oven. The PMMA was then coated with AZ5214 positive resist to a thickness of 1.4 μm. The resist was cured in air at 90° C. for 25 min. The areas of the resist to be removed were exposed to UV light at an intensity of about 100 mJ/cm². The sample was immersed in AZ 422MIF developer (Hoechst Celanese Corp.) for 150 sec. to remove the photoresist exposed to UV light. The sample was then exposed to a low power oxygen plasma ("descumming"). The polymethyl methacrylate in open areas (where the 5214 resist had been removed) was exposed using a collimated deep UV (220–260 nm) source at an intensity of 10 J/cm². The exposed polymethyl methacrylate was developed in toluene for 4 min. $Ar^+$ ion beam milling at an oblique angle (75°) was used to transfer the pattern into the gold and $YBa_2Cu_3O_{7-x}$ wherein x is 0 to 0.5 layers. Two point resistivity measurements were used to determine when the $YBa_2Cu_3O_{7-x}$ wherein x is 0 to 0.5 layer had been completely removed and the devices therefore isolated.

The photoresist and polymethyl methacrylate were removed by a 3 min. oxygen plasma treatment in a YES CV-100 plasma system (Yield Engineering Systems, 2119 Oakland Rd., San Jose, Calif. 95131). The plasma system was a conventional 2.45 GHz barrel etcher run at 500 W power and 1.2 tort (160 Pa) pressure and a substrate temperature of 150° C.

The wafer was then coated with polymethyl methacrylate and positive photoresist as above except that the resist was Shipley 1400-37 (Shipley Company Inc., 500 Nickerson Rd., Marlboro, Mass. 01752) and both materials were spun on at 2,000 rpm. The wafer was then diced and the coatings removed with acetone and isopropyl alcohol.

Figure 11:
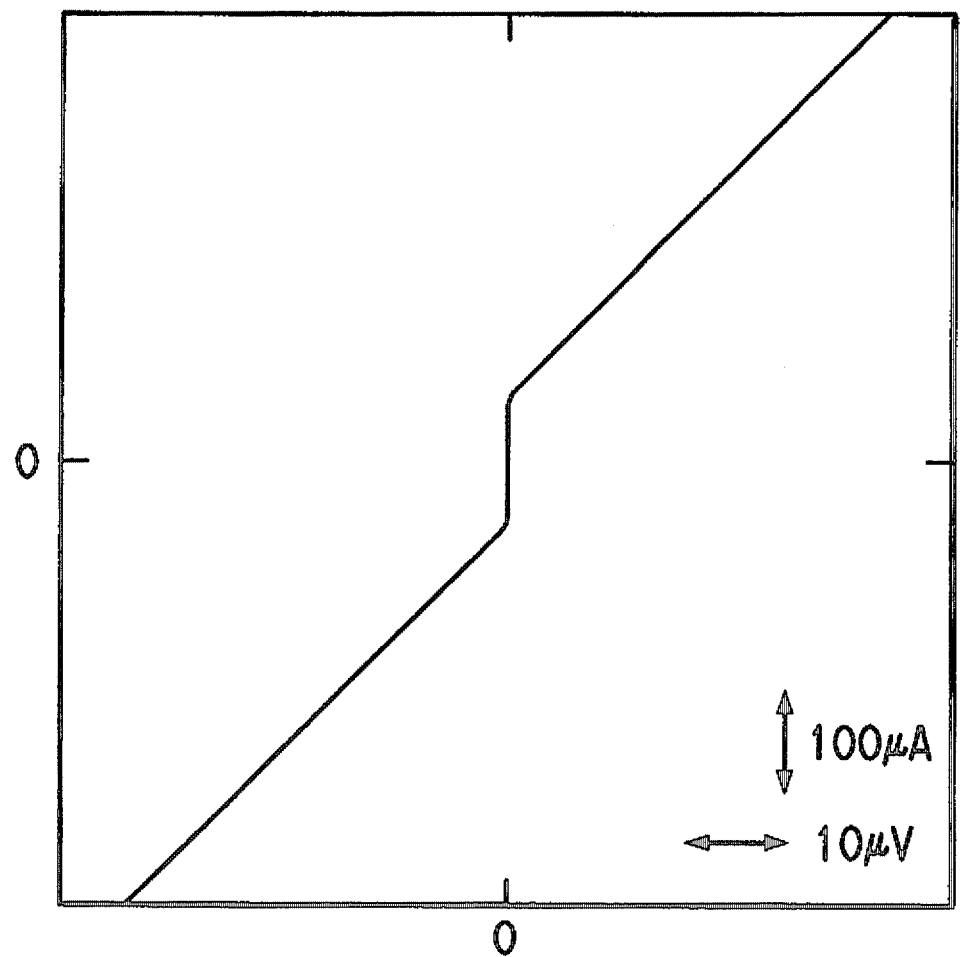
FIG. 11 is the current-voltage characteristic of an 8 μm wide step edge SNS JJ having the structure of FIG. 5 and made by off-axis planar magnetron sputtering utilizing the gas flow manifold device of the invention. The current through the device in μA is plotted as a function of the voltage in μV across the device.
Figure 11:
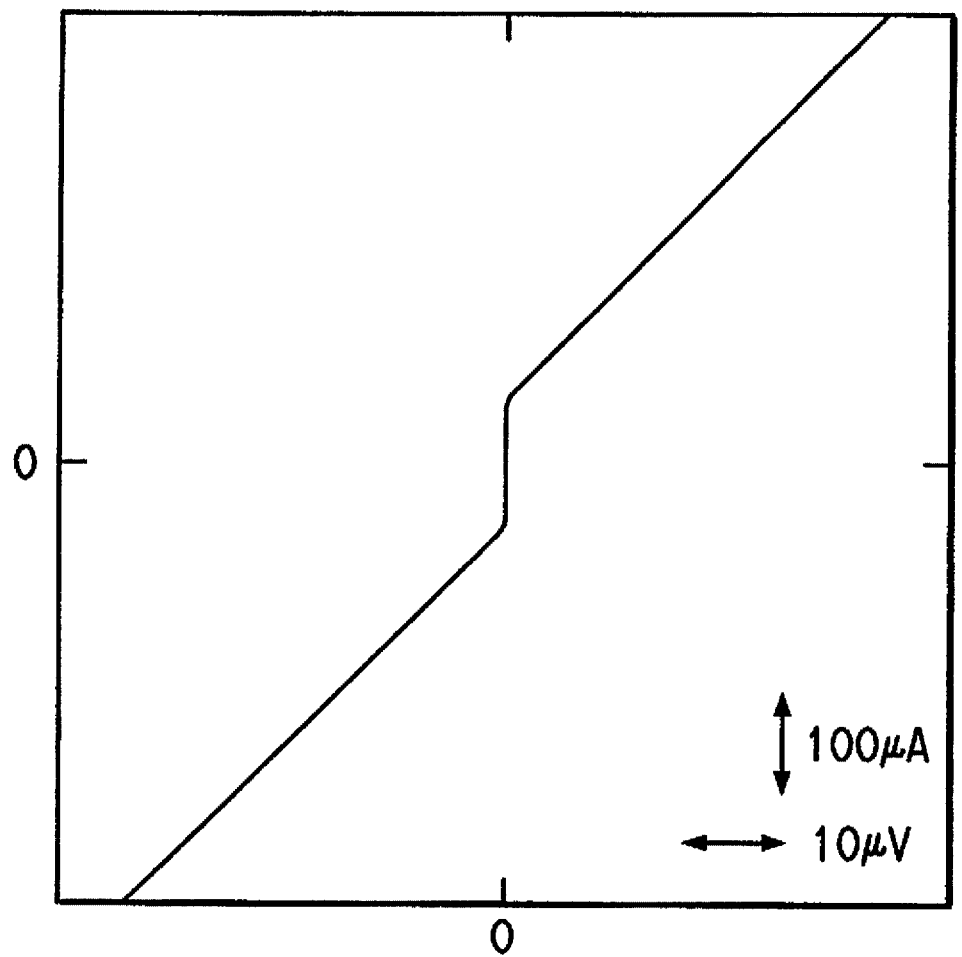

Individual die were mounted in a test probe and electrical properties were measured at 5K. The $YBa_2Cu_3O_{7-x}$ wherein x is 0 to 0.5 film was superconducting; test lines on the upper and lower halves of die #3.3 had critical currents of 15 mA and 11 mA, respectively. FIG. 11 shows the non-linear current-voltage characteristic of an 8 μm wide SNS junction from the same die. The current in μA is plotted as a function of the voltage in μV. The $I_cR_n$ product for this device is about 11 μV.

EXAMPLE 4

An improved Step-edge SNS Josephson Junctions is fabricated in multiple positions across a 5 cm diameter substrate by a process similar to that of Example 3 with the addition of a gas flow ring attached to the $CeO_2$gun and the deposition of an additional $CeO_2$layer between the $YBa_2Cu_3O_{7-x}$ wherein x is 0 to 0.5 and the gold layers as shown in FIG. 6. The gas flow ring allows the uniform and directional deposition of the $CeO_2$necessary to form the structure of FIG. 6 over large areas.

What is claimed is:

1. An improved device for off-axis magnetron sputter deposition of inorganic oxide compounds of the type having a sputter gun, a target having a surface, a substrate, gas flow means and an enclosure chamber; wherein the improvement comprises a single hollow gas manifold positioned between the substrate and the target and closer to the target than to the substrate, said manifold having at least one gas inlet and at least one outlet opening on the manifold, said outlet opening positioned such that a mixture of inert gas and reactive gas flowing from said at least one opening directs sputtered material away from the target surface and in the direction of the substrate.

2. The device of claim 1 wherein the sputter gun is of the type having a dark space shield having an opening through which a target is exposed, wherein the manifold is positioned adjacent to and in contact with the sputter gun's dark space shield and around the opening such that the manifold's plane is parallel to the target surface.

3. The device of claim 1 wherein the at least one outlet opening is positioned on the surface of the manifold facing away from the target.

4. The device of claim 3 further comprising screws or flexible nozzles fitted into at least one outlet opening to block gas flow or to direct gas flow respectively.

5. The device of claim 1 wherein the manifold comprises a plurality of outlet openings positioned in two groups, such that the outlet openings in the first group are positioned on the surface of the manifold at from about 80 to about 110 degrees to the manifold's plane and the outlet openings in the second group are positioned on the surface of the manifold at from about 30 to about 60 degrees to the manifold's plane, said first group of outlet openings being spaced from said second group of outlet openings by a discreet distance.

6. The device of claim 5 wherein the first group of outlet openings are positioned at about 90 degrees to the plane of the manifold, and the second group of outlet openings are positioned at about 45 degrees to the plane of the manifold.

7. The device of claim 1 wherein the manifold is in the shape of a hollow annular ring.

8. The device of claim 5 Wherein the manifold is in the shape of a hollow annular ring and wherein the outlet openings of the first group are centered around a point on the ring which is closest to the center of an area upon which deposition will occur and the outlet openings of the second group are centered around a point of the ring which is furthest away from the center of an area upon which deposition will occur.

9. The device of claim 1 wherein a gas flow is provided throughout the manifold symmetrically around a plane, said plane defined by a first line perpendicular to a target surface at the center of the target and a second line perpendicular to a substrate surface and at the center of the area over which deposition will occur, provided that said two lines intersect.

10. The device of claim 9 wherein the manifold comprises a plurality of outlet openings positioned symmetrically around said plane.

11. The device of claim 1, wherein said manifold comprises means for delivering a mixture of inert gas and reactive gas at a flow velocity of at least about $9.77 \times 10^3$ cm/sec.

* * * * *